United States Patent
Wang et al.

(10) Patent No.: US 7,208,841 B2
(45) Date of Patent: Apr. 24, 2007

(54) SEMICONDUCTOR DEVICE WITH STRAIN RELIEVING BUMP DESIGN

(75) Inventors: James Jen-Ho Wang, Phoenix, AZ (US); Jin-Wook Jang, Chandler, AZ (US); Alfredo Mendoza, Mesa, AZ (US); Rajashi Runton, Chandler, AZ (US); Russell Shumway, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 273 days.

(21) Appl. No.: 10/909,124

(22) Filed: Jul. 30, 2004

(65) Prior Publication Data

US 2005/0023680 A1 Feb. 3, 2005

Related U.S. Application Data

(62) Division of application No. 10/631,102, filed on Jul. 31, 2003, now Pat. No. 6,790,759.

(51) Int. Cl.
*H01L 23/48* (2006.01)
*H01L 23/52* (2006.01)
*H01L 29/40* (2006.01)
*H05K 1/00* (2006.01)

(52) U.S. Cl. .................. 257/780; 257/781; 257/782; 257/784; 257/751; 439/81

(58) Field of Classification Search ............... None
See application file for complete search history.

(56) References Cited

U.S. PATENT DOCUMENTS 5,518,964 A * 5/1996 DiStefano et al. .......... 438/113

(Continued)

OTHER PUBLICATIONS

John C. Carson, "Advances in Chip Level Packaging" (2002 Lecture notes, Johns Hopkins University).

(Continued)

*Primary Examiner*—Jasmine Clark
(74) *Attorney, Agent, or Firm*—John A. Fortkort; Fortkort & Houston P.C.

(57) ABSTRACT

A semiconductor device (51) is provided. The device (51) comprises a die (53) having a contact pad (61) thereon, a redistribution conductor (59) having a base portion (64) which is in electrical communication with the contact pad (61) and a laterally extending portion (63), a bumped contact (65) which is in electrical communication with the redistribution conductor (59), and a passivation layer (57) disposed between the laterally extending portion (63) of the redistribution conductor (59) and the die (53). Preferably, the redistribution conductor (59) is convoluted and is adapted to peel or delaminate from the passivation layer (57) under sufficient stress so that it can shift relative to the passivation layer (57) and base portion (64) to relieve mechanical stress between substrate (69) and the die (53). Bump and coiled redistribution conductor (59) accommodating small CTE mis-match strain without failure allows DCA flip-chip to be reliable without underfill or additional assembly process.

22 Claims, 5 Drawing Sheets

U.S. PATENT DOCUMENTS

| | | | | |
|---|---|---|---|---|
| 5,876,859 | A | * | 3/1999 | Saxelby et al. ............. 428/621 |
| 5,989,936 | A | * | 11/1999 | Smith et al. ................ 438/106 |
| 6,362,087 | B1 | | 3/2002 | Wang et al. ................ 438/612 |
| 2002/0036100 | A1 | * | 3/2002 | Slemmons et al. ......... 174/255 |
| 2003/0134496 | A1 | | 7/2003 | Lee et al. ................... 438/612 |

OTHER PUBLICATIONS

"MicroPro Proves Effective for uBGA Sphere Attach", Speedline (a publication of Speedline Technologies), Issue #2 (Summer 2001).

D. Light, D. Castillo, M. Beroz, M. Nguyen, and T. Wang, "Vertical Expansion (WAVE) Packaging Process Development" (published by Tessera Technologies, 2001).

Joseph Fjelstad, "Strategies for Creating Compliant IC Packages at Near Chip Size" (INTERPACK 1999).

K. Klein, T. Leichle, E. Moss, P. Sassone and X. Wei, "A Survey of Compliant Interconnects for Wafer Level Packaging" (Dec. 13, 2001).

\* cited by examiner

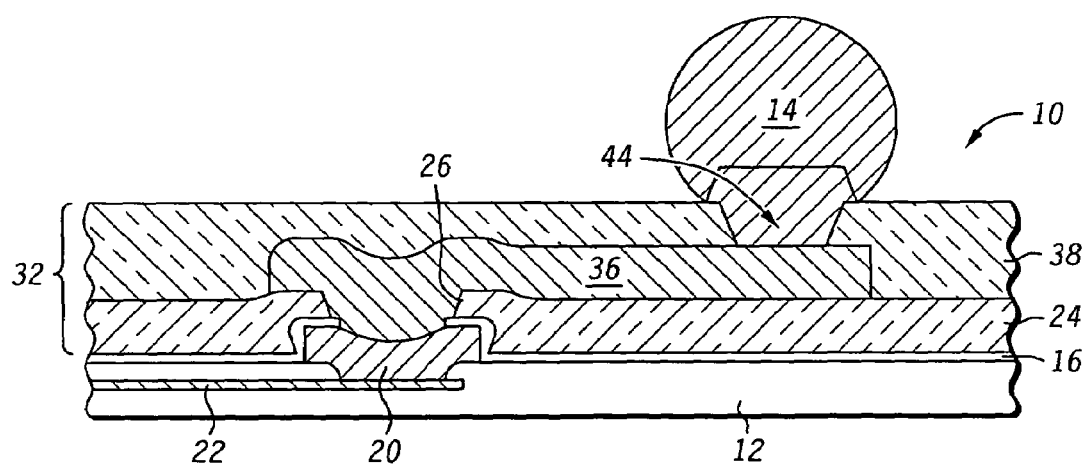
*- PRIOR ART -* *FIG. 1*
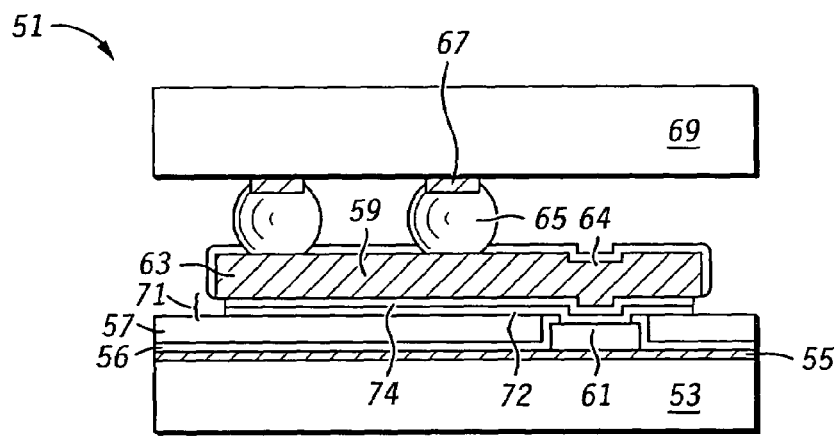
*FIG. 2*
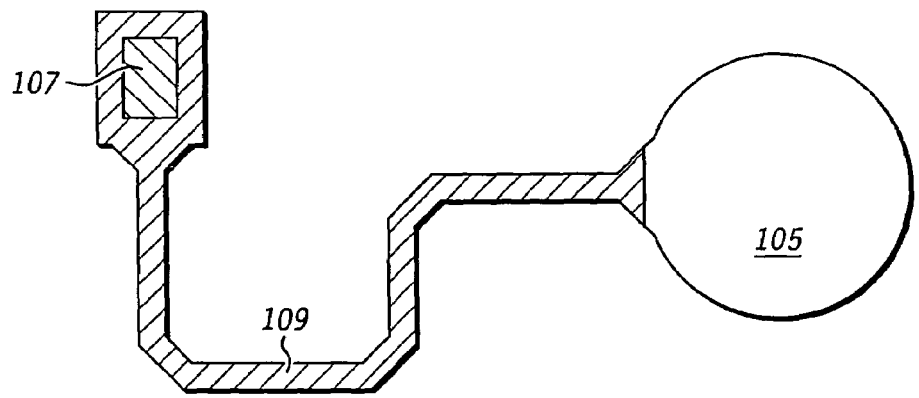
*FIG. 3*

SEMICONDUCTOR DEVICE WITH STRAIN RELIEVING BUMP DESIGN

This application is a Divisional of application Ser. No. 10/631,102, filed Jul. 31, 2003, now U.S. Pat. No. 6,790,759.

FIELD OF THE INVENTION

The present invention relates generally to bumped semiconductor components, and more particularly to bumped semiconductor components equipped with redistribution circuitry and suitable for wafer level BGA packaging.

BACKGROUND OF THE INVENTION

Semiconductor components such as die, chip scale packages, ball grid arrays (BGAs), and wafers frequently include terminal contacts in the form of metal bumps. Components equipped with such contacts are often referred to as "bumped" components.

FIG. 1 illustrates one type of prior art flip chip semiconductor package. The package 10 comprises a semiconductor die 12 and an array of bumped contacts 14 on the circuit side of the die 12. The bumped contacts 14 allow the package 10 to be surface mounted to a substrate, such as a printed circuit board (PCB). Typically, the bumped contacts 14 are made of solder, which allows the package 10 to be bonded to a substrate using a solder reflow process.

The die 12 contained in the package 10 includes a series of contact pads 20 which are in electrical communication with the bumped contacts 14. The die 12 also includes internal conductors 22 which are in electrical communication with the contact pads 20, and with various semiconductor devices and integrated circuits as may be formed on or in the die 12. The die 12 also contains first 16, second 24 and third 38 passivation layers. Typically, the first passivation layer is a material such as plasma oxynitride (PON), and the second and third passivation layers are benzocyclobutene (BCB). One or more openings 26 may be provided through passivation layers 24 and 16 to allow a redistribution conductor 36 (discussed in greater detail below) to be in physical contact with the contact pads 20.

For the sake of clarity, it is to be noted here that the PON layer is typically deposited as two separate layers, one of plasma oxide and the other of plasma nitride. It is treated as a single passivation layer here because deposition of the second layer does not require any intervening processing steps. By contrast, the deposition of each of the BCB layers requires intervening photo steps; hence, these layers are treated as distinct layers, even though their chemical composition may be similar or even identical.

The redistribution conductor 36 is formed on a surface of the second passivation layer 24. The redistribution conductor 36 is sputtered to a thickness typically less than 1 µm and is in electrical communication with the contact pads 20 and the bump contacts 14. The third passivation layer 38 covers the redistribution conductor 36. The redistribution conductor may be used, for example, to redistribute the signals from standard wire contact pads 20 located at the die perimeter to pads of an area array, such as a ball grid array (BGA). As shown in FIG. 1, the redistribution conductor 36 typically requires an under bump metallization (UBM) 44 for each bumped contact 14 to facilitate bonding of the bumped contact 14 to the redistribution conductor 36.

In semiconductor devices in which a flip-chip die is attached to a PCB or other substrate, a substantial amount of stress exists through the entire joint connecting the die to the substrate. This stress arises in part from coefficient of thermal expansion (CTE) differentials between the die and the substrate, with the result that varying amounts of stress and strain are applied to the joint regions as the die and substrate are exposed to thermal cycling. Over time, these stresses can result in mechanical and/or electrical failure of the joint. Accordingly, it has become a common practice in some flip-chip applications to provide an additional underfill material between the third passivation layer 38 and the substrate. This additional underfill material, which typically has a CTE coefficient somewhere between the CTE coefficients of the third passivation layer and substrate, buffers the large CTE differential stress between the third passivation layer and the substrate, thereby reducing or eliminating solder fatigue failure.

In a device such as that shown in FIG. 1, the second and third passivation layers are rigid and serve to mechanically reinforce the redistribution conductors and to clamp them in place. Consequently, a substantial amount of the CTE differential stresses in devices of this type are borne by the solder contacts 14 and by the second 24 and third 38 passivation layers. Indeed, in devices of this type, the redistribution conductors are typically too thin to withstand any significant amount of stress by themselves and tend to break if exposed to significant stresses, thus resulting in electrical failures. While the use of three passivation layers is advantageous insofar as it mechanically reinforces the redistribution conductors, it also has some drawbacks. For example, the addition of a third passivation layer increases the complexity and manufacturing cost of the device, while also making it more difficult to rework the device or to perform electrical probing on the redistribution conductor.

There is thus a need in the art for a die equipped with a redistribution conductor which is suitable for flip-chip applications and which does not require a third passivation layer or an underfill material. There is also a need in the art for a die fitted with a redistribution conductor that can relieve differential CTE stresses. These and other needs are met by the methodologies and devices disclosed herein and hereinafter described.

SUMMARY OF THE INVENTION

In one aspect, a device is provided which comprises (a) a semiconductor die or other substrate having a contact pad thereon, (b) a redistribution conductor having a base portion which is in electrical communication with the contact pad, and having a convoluted, laterally extending portion, and (c) a (typically organic) passivation layer disposed between the laterally extending portion and the die, and wherein the laterally extending portion preferably forms a frangible bond to the passivation layer. The device may also comprise a bumped contact in electrical communication with the redistribution conductor. The laterally extending portion may be serpentine or shaped like a sine wave, and preferably changes direction at least once, more preferably at least twice, and most preferably at least three times in going from the base to the bumped contact. The laterally extending portion has an average minimum thickness of at least about 3 microns, preferably within the range of about 8 to about 16 microns, and more preferably within the range of about 10 to about 14 microns, as measured along an axis extending through the center of, and orthogonal to, the laterally extending portion. The device may further comprise a PCB substrate in contact with said bumped contact, in which case the PCB substrate is preferably separated from the redistribution conductor by an open space rather than an underfill. The device preferably also comprises a dewetting agent disposed on surfaces of the laterally extending portion of the redistribution conductor. This dewetting agent, which is preferably sufficiently conductive so as to permit probing of the conductor and is typically about 200 nm in thickness, serves to prevent solder from wetting the redistribution conductor beyond the bump contact region, hence confining the solder bump to an area directly above the bump pad. The dewetting agent can be, but is not limited to, one or more of the materials (e.g., TiW) used as a seed metal for electroplating the redistribution conductor metal.

In another aspect, a device is provided which comprises (a) a semiconductor substrate (which may be, for example, a wafer or die) having a contact pad, (b) a passivation layer, (c) a redistribution conductor having a base portion which is in electrical communication with the die contact, and a laterally extending portion which extends over the passivation layer, and (d) a release layer disposed between the passivation layer and the laterally extending portion. The device may further comprise a bumped contact directly in electrical and mechanical contact with the redistribution conductor at a contact pad (in some embodiments, the bumped contact may instead be in contact with a UBM which is in electrical and mechanical contact with the redistribution conductor at the bump contact pad). The passivation layer is preferably disposed between the laterally extending portion of the redistribution conductor and the semiconductor substrate. The mechanical strength of the metal bump and the metallic redistribution conductor is greater than the adhesion of the metallic redistribution conductor to the passivation layer, which is typically polyimide or BCB. Consequently, although the adhesion between the passivation layer and the metallic redistributing conductor is sufficient to maintain integrity during wafer processing, probing, dicing and through assembly, the redistribution conductor will separate from the underlying passivation layer under sufficiently high stress. Without any outer passivation layer to clamp down the redistribution conductor, the redistribution conductor is able to move sufficiently to relieve stress from the substrate. The laterally extending portion of the redistribution conductor forms a frangible bond to the passivation layer and preferably terminates at one end on a contact pad base. The width of the laterally extending portion is equal to or greater than its thickness to provide mechanical strength, while being narrow enough to separate without line breakage. The laterally extending portion is connected to a bump pad of the same material, and preferably of the same thickness, as the redistribution conductor which forms a site for the solder bump to attach to the redistribution conductor. After the redistribution conductor separates from the underlying passivation layer, its serpentine coil design allows it to stretch and compress to accommodate movement of the solder bump and bump pad.

In yet another aspect, a method for making a semiconductor device is provided which comprises the steps of (a) providing a semiconductor substrate having a contact pad, (b) forming a passivation layer (and preferably two passivation layers, such as a first passivation layer comprising oxide/nitride and a second passivation layer comprising polyimide or BCB) over the substrate and patterning the passivation layer such that at least a portion of the contact pad is exposed, and (c) forming a redistribution conductor having a base portion which is in electrical communication with the contact pad and having a convoluted, laterally extending portion which extends over the passivation layer, wherein the laterally extending portion forms a frangible bond to the passivation layer. The method may further comprise the step of forming a release layer over the passivation layer, and the release layer may be disposed between the redistribution conductor and the passivation layer. The release layer may comprise TiW or other suitable materials which allow the redistribution conductor to separate from the passivation layer under sufficient stress so as to relieve strain on a solder joint connected to the redistribution conductor. The redistribution conductor is preferably formed by depositing a metallization layer over the first passivation layer, depositing and patterning a second passivation layer over the metallization layer, and electroplating the material of the redistribution conductor onto the exposed portion of the metallization layer. The material of the redistribution conductor is preferably electroplated to a minimum thickness of at least about 3 microns as measured along an axis extending through the center of, and orthogonal to, the laterally extending portion.

In still another aspect, a method for making a semiconductor device is provided. In accordance with the method, a semiconductor substrate is provided which has a contact pad. A first passivation layer is deposited over the substrate and is patterned such that at least a portion of the contact pad is exposed, and a metallization layer is deposited over the first passivation layer. A second passivation layer is then deposited over the metallization layer and is patterned such that at least a portion of the metallization layer in the vicinity of the contact pad is exposed. A redistribution conductor is then electroplated onto the exposed portion of the metallization layer such that the redistribution conductor has a base portion which is in electrical communication with the contact pad, and a laterally extending portion. The laterally extending portion preferably has an average minimum thickness of at least about 3 microns as measured along an axis extending through the center of, and orthogonal to, the laterally extending portion. More preferably, the laterally extending portion has an average minimum thickness within the range of about 8 to about 16 microns, and more preferably within the range of about 10 to about 14 microns, as measured along an axis extending through the center of, and orthogonal to, the laterally extending portion. The laterally extending portion is preferably patterned as convoluted or serpentine in shape. The laterally extending portion is typically connected to a solder joint and is preferably adapted to reduce stress applied to the solder joint by delaminating from the second passivation layer. This may be accomplished, for example, by making the bond between the second passivation layer and the metallization layer sufficiently frangible such that the laterally extending portion separates from the second passivation layer when sufficient stress is applied to the solder joint. Preferably, the redistribution conductor comprises copper, the metallization layer comprises a first layer of TiW and a second layer of copper, and the second passivation layer comprises a polyimide. The redistribution conductor is preferably in contact with at least one solder joint, in which case a dewetting agent for the solder may be deposited over portions of the redistribution conductor that are not in contact with the at least one solder joint. Both the metallization layer and the dewetting agent preferably comprise TiW.

These and other aspects are described in further detail below.

DESCRIPTION OF THE FIGURES

FIG. 1 is a cross-sectional illustration of a prior art semiconductor device equipped with redistribution conductors;

FIG. 2 is a simplified cross-sectional view of a bumped semiconductor die made in accordance with the teachings herein;

FIG. 3 is a top view of a redistribution conductor made in accordance with the teachings herein;

DETAILED DESCRIPTION

It has now been found that the above noted needs may be met by providing bumped semiconductor devices with redistribution conductors that are capable of releasing or delaminating from an underlying passivation layer and flexing so as to alleviate CTE differential stress, and which are thick enough so as to be able to withstand such flexing without electrical failure. Such redistribution conductors are described in greater detail below.

Figure 9:
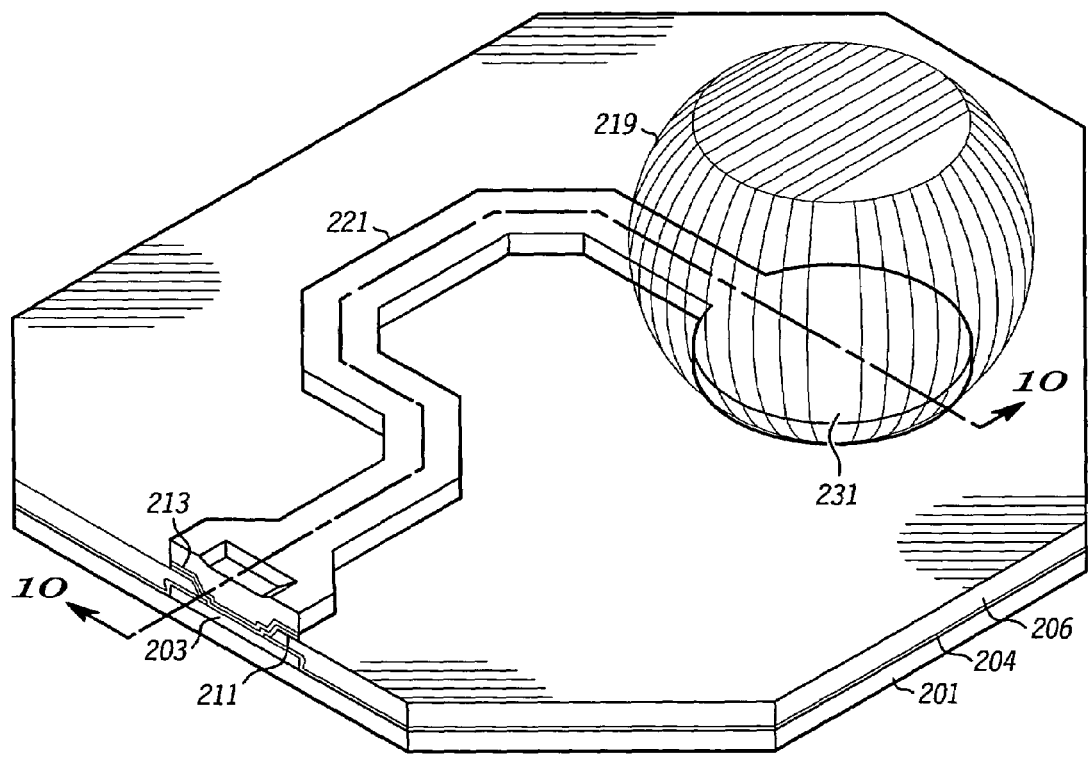
FIG. 9 is a perspective view of a bumped semiconductor die as it would appear after the processing steps illustrated in FIGS. 4–8.

FIG. 2 illustrates one example of a bumped semiconductor device 51 made in accordance with the teachings herein. For convenience of illustration, the device features and dimensions have been exaggerated in some aspects and condensed into a single plane, and a redistribution conductor 59, which is preferably essentially serpentine in shape (see FIG. 3), is depicted simply as straight conductor to allow for understanding of the device in a 2-dimensional cross-sectional drawing. However, one skilled in the art will appreciate that, in an actual device, these features may have relative dimensions that are different from those suggested by the figures, nor would these features necessarily be found within any single planar cross-section of the device. One possible embodiment of an actual layout for a bumped semiconductor device made in accordance with the teachings herein is depicted in FIG. 9.

The device 51 of FIG. 2 comprises a die 53 equipped with an internal conductor 55 and having a first passivation layer 56 and second passivation layer 57 disposed on its surface. The first passivation layer 56 is preferably a hard coating that provides moisture resistance and scratch resistance to the die, and may comprise plasma oxynitride (PON), oxides such as $SiO_x$, or borophosphosilate glass (BPSG). The second passivation layer 57 is preferably a compliant film that prevents mechanical stresses from fracturing the first passivation layer. The second passivation layer preferably comprises a polyimide, but may also comprise benzocyclobutene (BCB).

A redistribution conductor 59 is supported on a surface of the die, and is in physical and electrical contact with a metallization release layer 71 which comprises a layer of TiW 72 and a layer of copper 74. The redistribution conductor, which preferably comprises copper, includes a laterally extending portion 63 which extends over a portion of the second passivation layer 57, and a base portion 64 which is in electrical contact with a contact pad 61. The redistribution conductor 59 is also in electrical contact with one or more bumped contacts 65. In the particular device illustrated, stress from the PCB board 69 is not sufficiently high to cause release of the redistribution layer from the second passivation layer 57.

In some embodiments, the redistribution conductor 59 may include an under bump metallization layer (UBM) (not shown) for each bumped contact 65 to facilitate bonding of the bumped contact thereto. However, the use of a UBM is not necessary, since the solder bump contact 65 can directly attach to the redistribution conductor 59. In the particular embodiment depicted, the bumped contacts 65 form a solder joint between the redistribution conductor 59 and the contact pads 67 of an adjacent PCB board 69.

Figure 15:
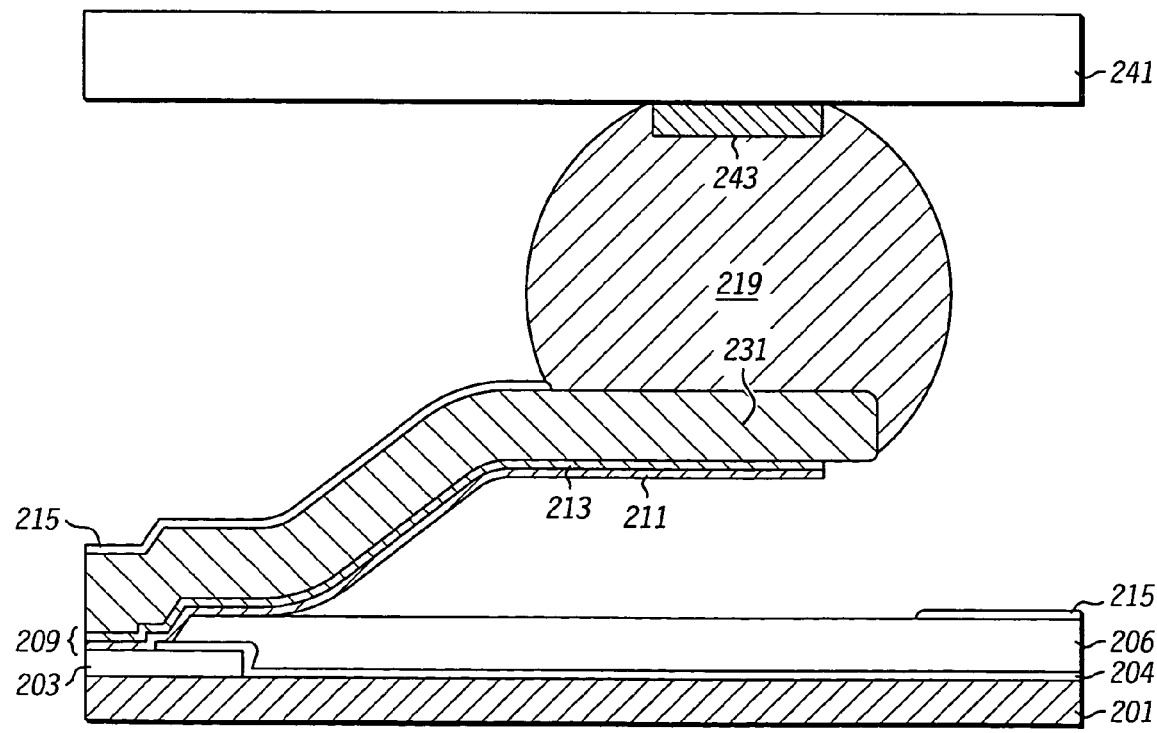
FIG. 15 is a cross-sectional illustration showing the delamination that a redistribution conductor made in accordance with the teachings herein can undergo in order to relieve stress.

The redistribution conductor 59 may be formed through electrochemical deposition of copper or another suitable metal onto the metallization layer 71. The use of a metallization layer 71 is advantageous both because it serves as diffusion barrier between the die 53 and the redistribution conductor 59, and because it forms a frangible bond to the passivation layer 57. Hence, when the redistribution conductor is exposed to sufficient stress, partial release or delamination of the redistribution conductor 59 and metallization layer 71 from the second passivation layer 57 can occur, as depicted in FIG. 15. As explained in greater detail below, this release or delamination enables the semiconductor device to alleviate stress arising from CTE differentials without damage to the solder joints of the device or to the redistribution conductor, internal conductor, or semiconductor device.

The use of TiW as a metallization material is particularly advantageous in the practice of the methodologies disclosed herein, due to its electrical and physical properties. In particular, TiW has decent electrical conductivity and thus facilitates electroplating of the redistribution circuitry, after which it remains below the redistribution conductor to serve as a barrier metal and as a release layer. Moreover, because it resists wetting by most commonly used solders, it may also be deposited (typically at a thickness of about 200 nm) above the redistribution conductor to serve as a solder mask. Absent the use of a solder mask, some solders may tend to wet the entire surface of the redistribution conductor during reflow. Since the devices described herein typically do not require any passivation layers above the redistribution conductor, the electrical conductivity of TiW also means that, when it is used as a solder mask, electrical probing of the circuit is possible at any point along the surface of the redistribution conductor. By contrast, in prior art devices (such as that shown in FIG. 1) that utilize a third passivation layer above the redistribution conductor, special openings must be provided in the passivation layer to accommodate probing. Furthermore, TiW has excellent adhesion to aluminum bond pads and to many of the materials that would be useful in the first passivation layer 56. On the other hand, if polyimide is used as the second passivation layer, the bond between TiW and the second passivation layer will be relatively weak, thus allowing the redistribution conductor to release under stress as described herein so as to achieve stress reduction.

FIG. 3 is a top view of a redistribution conductor 109 made in accordance with the teachings herein. The redistribution conductor 109 follows a convoluted path in going from an internal contact pad 107 to the bumped contact 105. The pad shown as the bumped contact 105 is preferably circular, and forms the base of the spherical solder ball (see, e.g., FIG. 9).

Since the redistribution conductor is convoluted, it has an inherent flexibility, much like a coiled telephone cord, that allows it to lengthen, twist, and otherwise absorb strain without breaking copper wire resulting in loss of electrical functionality. Indeed, the use of a convoluted redistribution conductor has been found to improve the strain capability of the conductor more than six-fold as compared to non-convoluted conductors made from the same materials and having similar dimensions.

The convoluted path followed by the redistribution conductor 109 may be serpentine, sinusoidal, S-shaped, or irregular, or it may be described by various combinations of curved or angled segments. For example, a curved line may consist of many linear segments joined together to approximate the curvature. To simplify design, three linear segments may be joined together to accomplish a 90° bend. Preferably, the redistribution conductor does not contain sharp (e.g., 90°) bends, but utilizes a greater number of more obtuse bends to collectively accomplish the same effect, since this reduces the stress concentration points that can occur at sharper corners. Thus, the bends have angles that are typically within the range of about 115° to about 155°, preferably within the range of about 125° to about 145°, and more preferably within the range of about 130° to about 140 °. Most preferably, the bends have angles of about 135°.

As suggested above, the redistribution conductor may be grown directly on the polyimide layer with a metallization layer such as TiW/Cu, which forms a frangible bond with the underlying (typically polyimide) passivation layer. Under conditions of extreme stress, such that the peel force between the metallization release layer and the passivation layer is exceeded, the redistribution conductor can release from the polyimide layer. Such release allows flexibility of motion for the convoluted redistribution conductor, and thus allows the redistribution conductor to shift, thereby relieving stress on remaining redistribution conductors that are still attached. When stress exceeds the peel force, delamination of other redistribution conductors occurs. Delamination continues until the remaining stress on the die is reduced to a level below the peel force. The redistribution conductor is typically sufficiently thick in cross-section so that it has sufficient mechanical strength to avoid breaking either before or after such release. The thickness of the redistribution layer also renders it more resistant to corrosion. By contrast, in prior art redistribution conductors such as those depicted in FIG. 1, the conductor is typically less than 1 microns in thickness and cannot, by itself, support any significant amount of stress or strain. Indeed, it is for the purposes of providing corrosion protection and improving mechanical integrity that the use of a third passivation layer above the redistribution conductor is common in the prior art.

The thickness of redistribution conductors made in accordance with the teachings herein can vary. Preferably, however, the redistribution conductor is sufficiently thick (e.g., at least about 3 microns thick, as measured across its thinnest dimension) that it can tolerate a substantial amount of stress and strain and can withstand corrosion. While there is no particular upper limit to the possible thickness of redistribution conductors made in accordance with the teachings herein, after a certain point, some of the mechanical benefits gained from increased thickness are offset by increased costs and processing times. Hence, redistribution conductors made in accordance with the teachings herein are preferably within the range of about 5 to about 20 microns, more preferably within the range of about 8 to about 16 microns, and most preferably within the range of about 10 to about 14 microns in thickness, as measured along an axis extending through the center of, and orthogonal to, the laterally extending portion.

Figure 4:
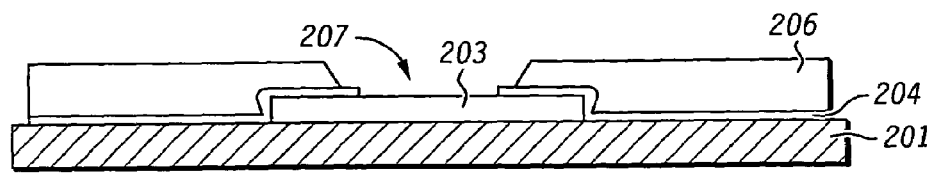
FIGS. 4–8 are cross-sectional illustrations of a method for making a bumped semiconductor die in accordance with the teachings herein.
Figure 5:
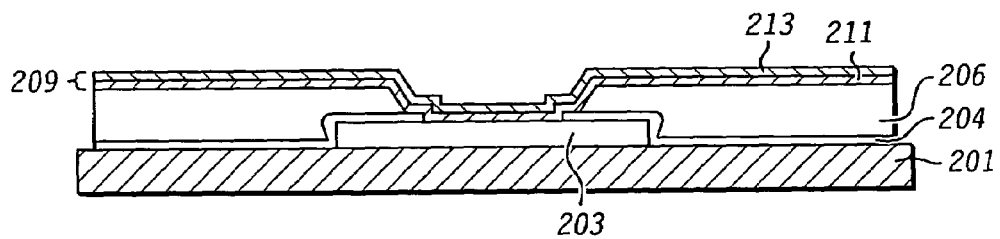
Figure 6:
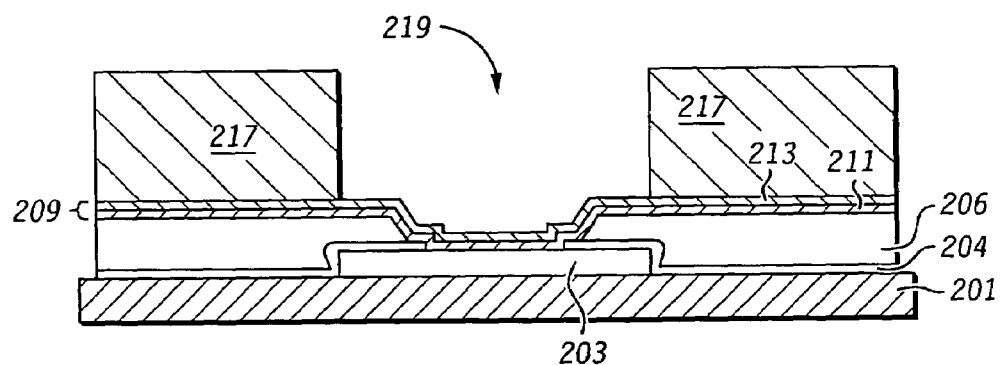

The redistribution conductors described herein may be achieved by a number of different fabrication routes. One possible route is illustrated in FIGS. 4–8. With reference to FIG. 4, a die 201 having a contact pad 203 thereon is provided. In one embodiment, the contact pads are formed from aluminum or an aluminum alloy. This contact pad is typically the top internal conductor for integrated semiconductor devices. Polyimide 206 and plasmaoxynitride (PON) passivation layers 204 are disposed over the die and over a portion of the contact pad. The passivation layers are then patterned and exposed such that a portion of the contact pad is exposed by way of an opening 207. A metallization 209 is then sputtered onto the resulting article as shown in FIG. 5. The metallization 209 comprises two layers: a conductive release layer 211 and a conductive seed layer 213. In a preferred embodiment, the release layer comprises TiW and the conductive seed layer comprises copper.

Next, a layer of spin-on photoresist 217 is deposited over the structure. The photoresist is then patterned, exposed and developed to define an opening 219 which exposes a portion of the metallization. The portion of the metallization that is exposed extends over the contact pad and a portion of the passivation layers.

Figure 7:
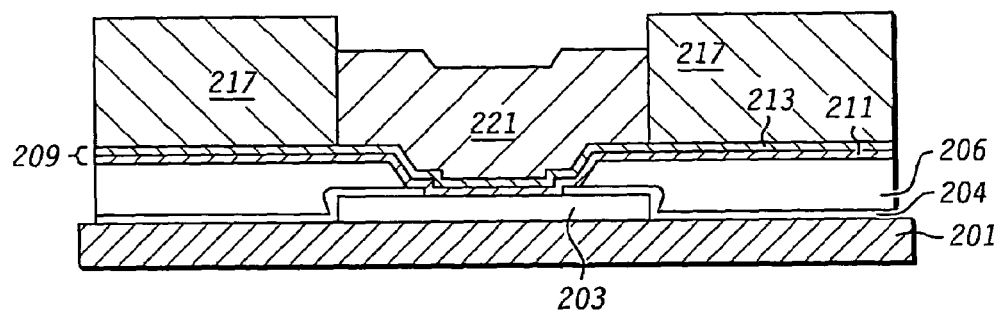
Figure 8:
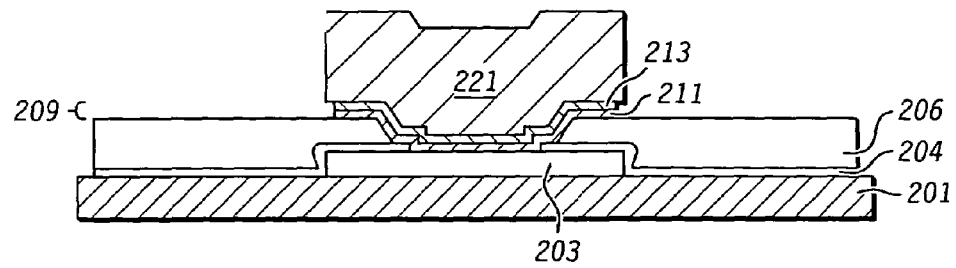

As shown in FIG. 7, after the opening is formed, the metal (preferably copper) which is used to form the redistribution conductor 211 is electroplated onto the exposed portion of the metallization 209. The photoresist is then stripped, and the exposed metallization 209 is removed with an appropriate etch as shown in FIG. 8. For example, if the metallization 209 comprises a conductive release layer 211 of TiW and a conductive seed layer 213 of copper, the conductive seed layer 213 may be removed with a chlorite or persulfate copper etchant using a spray acid tool or, alternatively, in an agitated bath, and the conductive release layer 211 may be removed with a hot hydrogen peroxide solution. Preferably, the conductive release layer 211 and the conductive seed layer 213 are sufficiently thin that the exposed portions of these layers are removed after only brief exposure to these etchants. Moreover, it is preferred that the redistribution conductor 221 is sufficiently thick compared to the conductive release layer 211 and the conductive seed layer 213 that its dimensions are substantially unaltered by the etchants used to remove the exposed portions of these layers. As indicated in FIG. 10, etching of the conductive release layer 211 and the conductive seed layer 213 may result in a slight amount of undercutting underneath the redistribution conductor 221 and the bump contact 231 (see FIG. 10).

FIG. 9 is a perspective view illustrating the redistribution conductor 221 of FIG. 8, and hence shows how the device would appear after the steps depicted in FIGS. 4–8 have been completed. As seen therein, the redistribution conductor 221 extends across the surface of the final polyimide passivation layer 206 in a convoluted fashion from the contact pad 203 and terminates at a bump contact 231.

Figure 10:
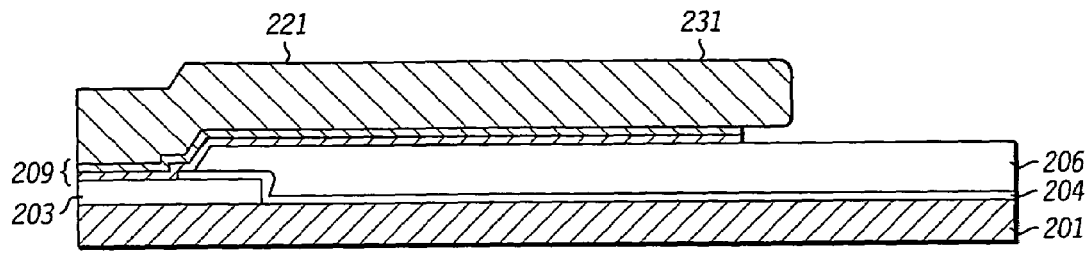
FIGS. 10–14 are cross-sectional illustrations of a method for making bumped die in accordance with the teachings herein.

The remaining processing steps leading to completion of the device are depicted in FIGS. 10–14. FIG. 10 depicts the device as it would appear in a cross-section taken along CURVE 10—10 of FIG. 9, which follows the midpoint of the convoluted redistribution conductor 221 from a point just after the contact pad 203 to the bump contact 231 (see FIG. 9). For ease of illustration, the cross-section has been flattened into a single plane and the dimensions of some elements of the device have been reduced.

As shown in FIG. 10, at this point in the process, the device comprises a die 201 having an aluminum contact pad 203 thereon. Polyimide 206 and plasmaoxynitride (PON) 204 passivation layers are disposed over the die and over a portion of the contact pad 203, and the metallization 209, comprising layers of TiW 211 and copper 213, is disposed over the polyimide layer 206.

Figure 11:
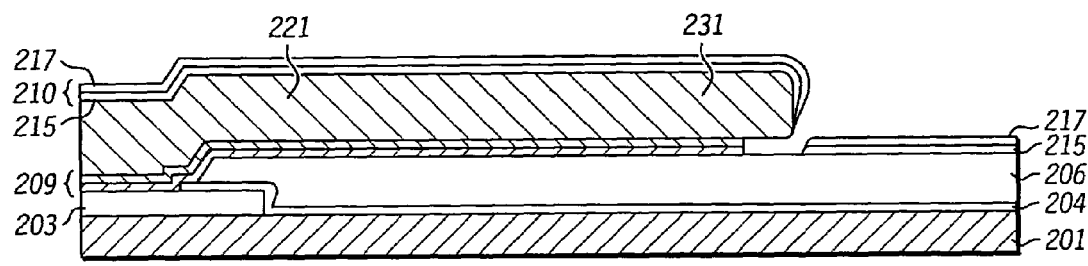
Figure 12:
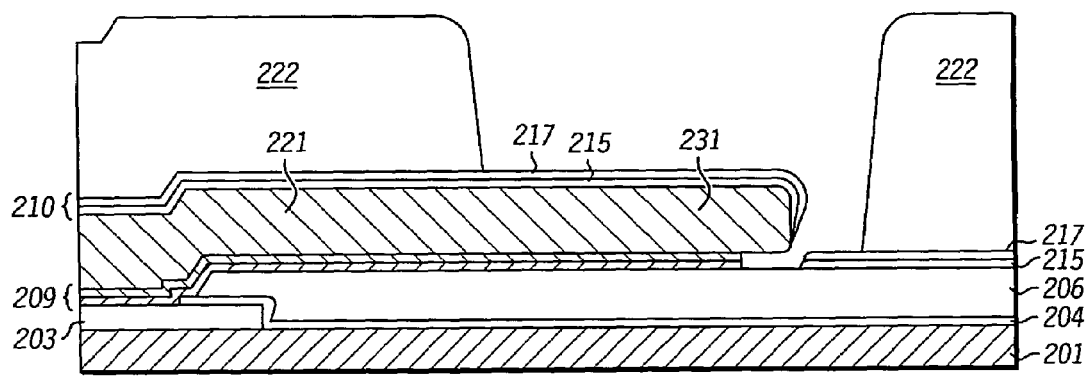
Figure 13:
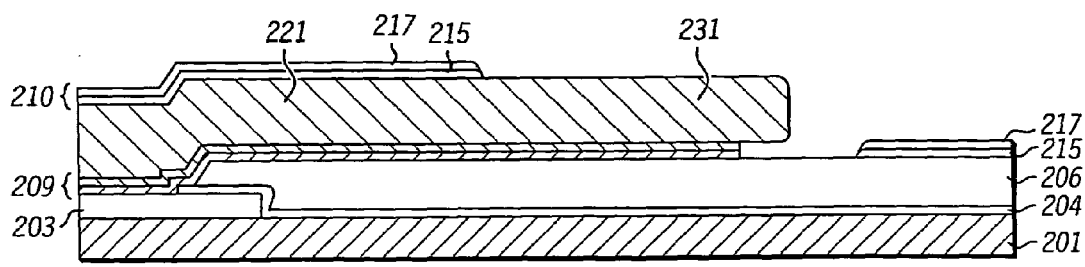

As shown in FIG. 11, an additional metallization 210 is then sputtered over the die. Preferably, the additional metallization 210 comprises a layer of TiW 215 and a layer of Cu 217, though other materials and numbers of layers may also be utilized. A layer of photoresist 222 is then deposited as shown in FIG. 12. This photoresist is sufficiently thick (typically about 15 microns in thickness) to coat over the redistribution conductor 221. The photoresist is then exposed, developed and baked to expose a portion of the redistribution conductor in the vicinity of the bump contact 231 as shown in FIG. 12. The layers of TiW 215 and Cu 217 are then removed from this exposed portion of the redistribution conductor by etching the metals using the photoresist as an etch mask. The photoresist is then stripped, as shown in FIG. 13.

Figure 14:
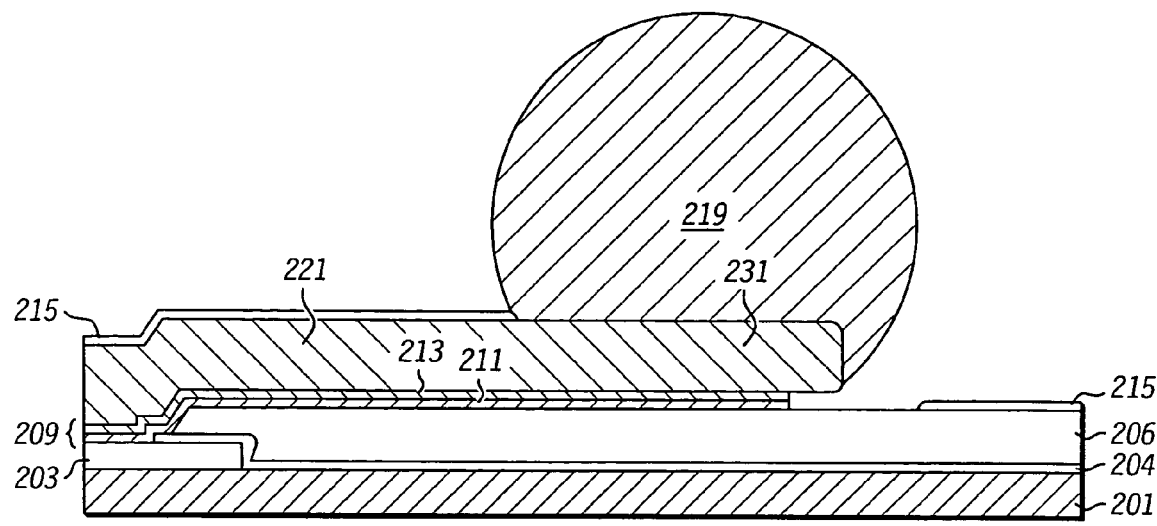

Next, a cleaner, which may be, for example, a chlorite or persulfate copper etchant, is used to prepare the redistribution conductor 221 for stencil bumping. The cleaner completely removes the thin Cu layer 217 (see FIG. 13) above the layer of TiW 215 as shown in FIG. 14. The resulting structure may then be subjected to cleaning with an $O_2$ plasma or through other means to remove residues left behind by the foregoing processing steps. Conventional solder bump metals such as eutectic SnPb or suitable lead free solders, which are available as solder pastes, may then be used in a stencil bumping operation to bump solder onto the bump contact 231. During subsequent reflow, the solder 219 wets the exposed portion of the redistribution conductor 231 but does not wet the portion of the redistribution conductor 221 covered over by the layer of TiW 215. The solder 219 forms a spherical bump directly on the redistribution conductor 221 as shown in FIG. 14.

The method described in FIGS. 10–14 permits the use of a redistribution conductor without necessitating the use of a third passivation layer as a solder mask since, as noted above, the layer of TiW serves as the solder mask. Moreover, the layer of TiW is thin and forms an integral part of the redistribution conductor, and can thus move and twist along with the redistribution conductor without breaking.

The device shown in FIG. 14 has a number of advantages, some of which have already been mentioned. Most notably, while prior art devices typically require the use of an underfill material or additional passivation layers to accommodate CTE differential stresses in flip-chip assemblies, the use of an underfill material is not required with the devices described herein, since these devices can achieve CTE differential stress reduction by undergoing release and move slightly to relax stress. This effect is illustrated in FIG. 15. Thus, when devices made in accordance with the teachings herein are attached to a bond pad 243 on a PCB 241 or other mounting substrate, CTE differential stresses between the PCB and the die can be relieved through delamination at the frangible interface existing between the TiW layer 211 and the polyimide passivation dielectric 206, since this interface is relatively weak due to the poor adhesion between the two layers. Consequently, the redistribution conductor 221 peels away from the polyimide surface 206 under stress as shown in FIG. 15. Since the polyimide passivation layer 206 is a passive surface, the delamination does not alter the electrical characteristics of any devices in the die 201. Furthermore, the redistribution conductor 221 is relatively strong due to its thickness, and its serpentine shape allows it to behave like a coil that stretches or contracts without mechanical or electrical failure.

A die has been provided herein which is fitted with a redistribution conductor having a unique design that allows it to withstand differential CTE stresses such that the die does not require the use of an underfill material. The redistribution conductor is designed such that it can separate from the die surface and can stretch or contract to accommodate CTE differential stresses between the die and the PCB substrate.

The above description of the invention is illustrative, and is not intended to be limiting. It will thus be appreciated that various additions, substitutions and modifications may be made to the above described embodiments without departing from the scope of the present invention. For example, it is preferred that the redistribution conductor is convoluted, because this results in a more compact arrangement that also allows stress relief. However, one skilled in the art will appreciate that a similar effect may also be achieved through the use of a linear redistribution conductor of sufficient length that is releasably attached to an underlying passivation layer as described herein. Accordingly, the scope of the present invention should be construed solely in reference to the appended claims.

What is claimed is:

1. A device, comprising:
   a semiconductor substrate having a contact pad thereon;
   a redistribution conductor having a base portion which is in electrical communication with the contact pad and having a laterally extending portion; and
   a passivation layer disposed between the laterally extending portion and the substrate;
   wherein the laterally extending portion forms a frangible bond to the passivation layer.

2. The device of claim 1, wherein the laterally extending portion is convoluted.

3. The device of claim 1, wherein the laterally extending portion terminates in a bumped contact, and wherein the laterally extending portion changes direction at least twice in going from the base portion to the bumped contact.

4. The device of claim 1, wherein the laterally extending portion terminates in a bumped contact, and wherein the laterally extending portion changes direction at least three times in going from the base portion to the bumped contact.

5. The device of claim 1, wherein the laterally extending portion is essentially serpentine in shape.

6. The device of claim 1, wherein the laterally extending portion comprises a plurality of linear segments joined together at an angle within the range of about 115° to about 155°.

7. The device of claim 1, wherein the laterally extending portion comprises a plurality of linear segments joined together at angles within the range of about 125° to about 145°.

8. The device of claim 1, wherein the laterally extending portion has an average minimum thickness of at least about 3 microns as measured along an axis extending through the center of, and orthogonal to, the laterally extending portion.

9. The device of claim 1, wherein the laterally extending portion has an average minimum thickness within the range of about 8 to about 16 microns as measured along an axis extending through the center of, and orthogonal to, the laterally extending portion.

10. The device of claim 1, further comprising a solder bump formed near an end of the redistribution conductor opposite the base portion and in electrical communication therewith.

11. The device of claim 1, further comprising a bumped contact in electrical communication with the redistribution conductor, and a PCB substrate in contact with said bumped contact.

12. The device of claim 11, wherein the PCB substrate is separated from the redistribution conductor by an open space.

13. The device of claim 1, further comprising a release layer disposed between the laterally extending portion and the passivation layer.

14. The device of claim 13, wherein the release layer comprises TiW.

15. A device, comprising:
a semiconductor substrate having a contact pad;
a passivation layer;
a redistribution conductor having a base portion which is in electrical communication with the contact pad, and a laterally extending portion which extends over said passivation layer; and
a release layer disposed between said passivation layer and said laterally extending portion.

16. The device of claim 15, wherein said release layer comprises TiW.

17. The device of claim 16, wherein said redistribution conductor comprises copper.

18. The device of claim 15, further comprising a solder bump formed near an end of the redistribution conductor opposite the base portion and in electrical communication therewith.

19. The device of claim 18, wherein the redistribution conductor is provided with a solder mask in the vicinity of said solder bump.

20. The device of claim 18, further comprising a mounting substrate in contact with said solder bump, and wherein the mounting substrate is separated from the redistribution conductor by an open space.

21. The device of claim 15, wherein the laterally extending portion has an average minimum thickness of at least about 3 microns as measured along an axis extending through the center of, and orthogonal to, the laterally extending portion.

22. The device of claim 15, wherein the laterally extending portion has an average minimum thickness within the range of about 8 to about 16 microns as measured along an axis extending through the center of, and orthogonal to, the laterally extending portion.

* * * * *